United States Patent [19]

Tomita et al.

[11] Patent Number: 4,678,539
[45] Date of Patent: Jul. 7, 1987

[54] DRY-ETCHING METHOD

[75] Inventors: Kazuyuki Tomita, Osaka; Masuo Tanno, Hirakata, both of Japan

[73] Assignee: Matsushita Electric Industrial Co., Ltd., Kadoma, Japan

[21] Appl. No.: 799,657

[22] Filed: Nov. 19, 1985

[30] Foreign Application Priority Data

Nov. 20, 1984 [JP] Japan ............................. 59-244945

[51] Int. Cl.⁴ .................... B44C 1/22; C03C 15/00; C03C 25/06
[52] U.S. Cl. ................................ 156/643; 156/646; 156/653; 156/657; 156/659.1; 156/662; 204/192.35; 252/79.1; 427/38
[58] Field of Search ............... 156/643, 646, 653, 657, 156/659.1, 662; 204/164, 192 E, 298; 427/38, 39; 252/79.1

[56] References Cited

U.S. PATENT DOCUMENTS 4,374,698  2/1983  Sanders et al. ............ 252/79.1 X

Primary Examiner—William A. Powell
Attorney, Agent, or Firm—Cushman, Darby & Cushman

[57] ABSTRACT

A dry-etching method for etching materials of the silicon group comprises: providing the material to be etched in a reaction chamber; supplying a mixed gas as the etching gas comprising carbon floride, oxygen and another gas wherein the other gas is a partially halogenated hydrocarbon; and thereafter subjecting the etching gas to high frequency electric current so as to make the mixed gas into a plasma whereby the material is etched.

9 Claims, 3 Drawing Figures

DRY-ETCHING METHOD

BACKGROUND OF THE INVENTION

1. Field of the Invention

The present invention generally relates to a dry-etching method for making electronic parts such as semiconductor devices or the like, and especially to a dry-etching method for silicon nitride ($Si_3N_4$).

2. Description of the Prior Art

In the conventional dry-etching method for silicon materials, especially for $Si_3N_4$ film on $SiO_2$ film or $Si_3N_4$ film masked by $SiO_2$ film, a mixed gas of carbon fluoride such as $CF_4$ which contains several percent of $O_2$ has been used. By making a high-frequency electric discharge in such etching gas, F radical reacts to Si and changes it into a volatile material, and etching process proceeds. Namely, an electron produced by the electric discharge reacts to $CF_4$ and changes it into an F radical, an F ion and an electron. The reaction proceeds by the following reaction as follows:

$$CF_4 + e \rightarrow CF_3 + F + e \quad (1)$$

Further, $CF_3$ reacts with an O radical and number of the F radical increases. The reaction proceeds by the following reaction:

$$\left. \begin{array}{l} CF_3 + O \rightarrow COF_2 + F, \\ CF_3 + 2O \rightarrow CO_2 + 3F \end{array} \right\} \quad (2)$$

And the F radical reacts with Si, so the etching process proceeds as follows:

$$Si + 4F \rightarrow SiF_4 \quad (3)$$

The conventional dry-etching method, however, has a problem in that it is impossible to selectively etch only $Si_3N_4$ film, which is intended to be selectively without hardly etching the $SiO_2$ base film, the $SiO_2$ masking film or the photo-resist (hereinafter abridged as P.R) Namely, the combination Si and O in $SiO_2$ is comparatively stable and hardly separated by the impinging of F radical. However, it is considered that the combination is separated by the impinging O radical, and the separated and retained Si combines with the F radical, and so the etching process proceeds. The reaction proceeds as follows:

$$\left. \begin{array}{l} SiO_2 + O \rightarrow SiO + O_2, \\ SiO + O \rightarrow Si + O_2 \end{array} \right\} \quad (4)$$

Therefore, in the use of mixed gas of carbon fluoride and O, the selection ratio of $Si_3N_4/SiO_2$ which is obtained is only 2 or 3 (which is defined as ratio of etching rate of $Si_3N_4$/etching rate of $SiO_2$).

As an alternative method, a case may be considered that the etching gas contains only carbon fluoride in the absence O. However, such case has another problem of C adhering onto the surface of $Si_3N_4$ film with the resultant substantial ceasing of the etching process.

On the other hand, another method is considerable, such that a part of F of carbon fluoride is replaced by bromine to selectively etch the $Si_3N_4$ film hardly etching the $SiO_2$ film. It is known that the selection ratio of $Si_3N_4/SiO_2$ increases by adding several percent of such bromic-replaced gas within the mixed gas of carbon fluoride and $O_2$ as mentioned above. The Br atom excited by plasma electric discharge is easy to combine with the O atom as follows:

$$Br_2 + O \rightarrow BrO + Br \quad (5)$$

In other words, the Br atom has an effect to suppress the O atom which contributes to the etching process. And responding to the suppression of function of the O atom, the number of F radical decreases and the etching rate of $Si_3N_4$ also decreases, and furthermore, the etching of $SiO_2$ is suppressed. As a result, the selection ratio of $Si_3N_4/SiO_2$ rises.

FIG. 1 shows the characteristic curves of the etching rate of $Si_3N_4$ and the selection ratio of $Si_3N_4/SiO_2$ as a function of the concentration of $CF_3Br$ (volume percent, namely equal mol %) under the condition of mixing $CF_3Br$ gas into ($CF_4$ gas containing 5 Vol % of $O_2$). In this experiment, the $Si_3N_4$ film and $SiO_2$ film accumulated on the surface of silicon substrate were etched by using the P.R pattern as a mask under the condition that the total quantity of gas flow was 50 SCCM (standard Cubic Centimeter per Minute, which means the quantity of flow in standard state of 273° K. and 760 mmHg.), the pressure of the gas was 0.4 Torr, and electric power of high frequency was 150 W (0.5 w/cm²). As shown in FIG. 1, responding to the increase of the concentration of $CF_3Br$, the etching rate of $Si_3N_4$ decreases, and moreover the etching of $SiO_2$ is suppressed, so the selection ratio of $Si_3N_4/SiO_2$ increases as shown by chain line curve in FIG. 1. And the characteristic curve of the concentration of $CF_3Br$ has a peak at the position over twelve percent. In this case, the etching rate of $Si_3N_4$ was 960 angstrom per minute and the selection ratio of $Si_3N_4/SiO_2$ was 6.1 and $Si_3N_4$/P.R was 4.0. As mentioned above, such prior art is known that the mixing of $CF_3Br$ gas into $CF_4 + 5\%$ $O_2$ makes the selection ratio of $Si_3N_4/SiO_2$ increase to some extent. But there is a strong demand for still higher selection ratio, with increasing the etching rate of $Si_3N_4$.

SUMMARY OF THE INVENTION

Accordingly, the purpose of the present invention is to provide an improved dry-etching method for etching material of the Si group, without hardly etching $SiO_2$ mask or $SiO_2$ base or P.R mask. The method is especially suitable for dry-etching silicon nitride ($Si_3N_4$) with a high selection ratio against P.R or $SiO_2$ film.

A dry-etching method for etching material such as silicon nitride in accordance with the present invention has steps of:

setting an etched material of silicon nitride into a reaction chamber, supplying a mixed gas as an etching gas, which is made of carbon fluoride, oxygen and another gas having such a molecular structure that a part of hydrogen of hydrocarbon is replaced by halogen, into the reaction chamber, and giving high frequency electric power so as to make the mixed gas as plasma state and to etch the etched material.

The material from the silicon group includes, for example, single crystalline silicon (used for making a semiconductor device), polycrystalline silicon, or silicon nitride.

DETAILED DESCRIPTION OF THE PREFERRED EMBODIMENT

The following is detailed description of the preferred embodiment of the present invention.

Figure 1:
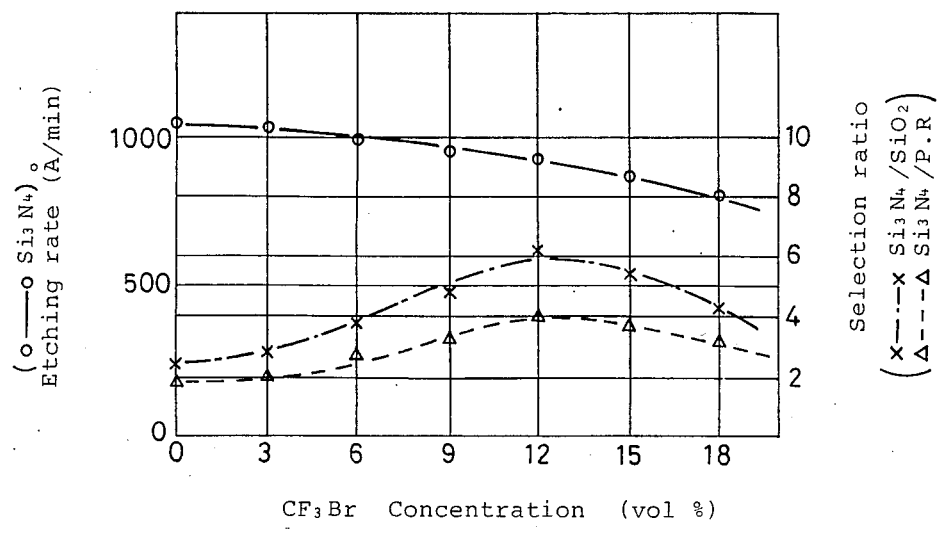
FIG. 1 is the graph of characteristic curves of the etching rate of $Si_3N_4$ and a selection ratio of $Si_3N_4/SiO_2$ and $Si_3N_4/P.R$ as a function of concentration of $CF_3Br$ under the condition of mixing the $CF_3Br$ gas into the $CF_4+5\%$ $O_2$ gas ($CF_4$ gas containing 5 Vol % of $O_2$ gas).
Figure 2:
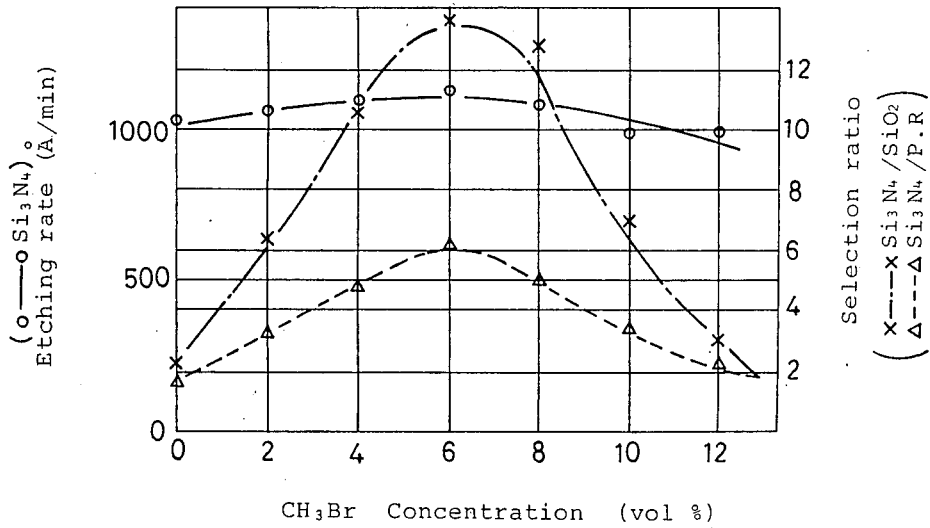
FIG. 2 is a graph of characteristic curves in accordance with the present invention of an etching rate of $Si_3N_4$ and a selection ratio of $Si_3N_4SiO_2$ and $Si_3N_4/P.R$ as a function of concentration of $CH_3Br$ under the condition of mixing the $CH_3Br$ gas into the $CF_4+10\%$ $O_2$ gas ($CF_4$ gas containing 10 Vol % of $O_2$ gas).

FIG. 2 shows a characteristic curves of an etching rate of $Si_3N_4$ and a selection ratio of $Si_3N_4/SiO_2$ and $Si_3N_4/P.R$ as a function of concentration of $CH_3Br$ under the condition of mixing $CH_3Br$ gas into $CF_4+10\%$ $O_2$ gas ($CF_4$ gas containing 10 Vol % of $O_2$ gas).

Figure 3:
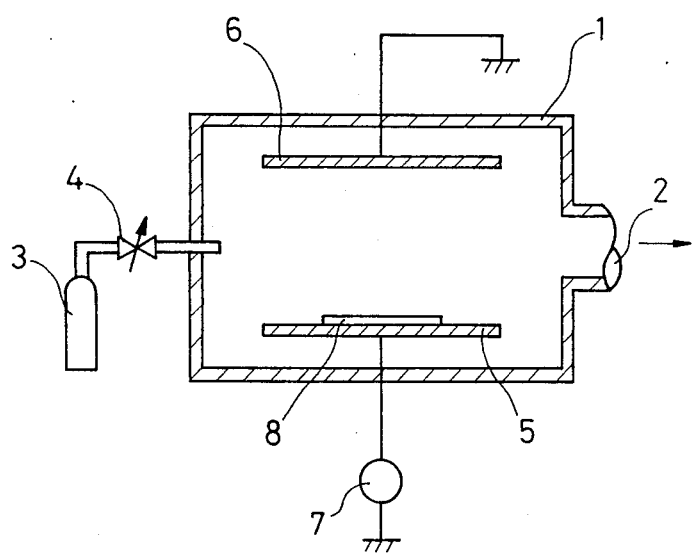
FIG. 3 is a cross sectional view of an etching apparatus for use in the present invention.

FIG. 3 is a cross sectional view of an etching apparatus which is used in the embodiment in accordance with the present invention. The etching apparatus comprises a reaction chamber 1 which is to be filled with an etching gas kept in 0.4 Torr, an exhaust opening 2, a gas cylinder 3 filled with the etching gas of high pressure, a flow control valve 4, a power supplying electrode of high frequency of electric power 5, a grounded electrode 6, and an electric power source 7 for supplying high frequency electric power for the power supplying electrode 5. A substrate 8 which is to be etched by the etching gas is disposed on the surface of the power supplying electrode 5. In the embodiment of the present invention, the substrate 8 is Si wafer which has an $Si_3N_4$ film or $SiO_2$ film on its surface. In this embodiment, etching process is made under the condition that the total quantity of gas flow is 50 SCCM, the pressure of gas is 0.4 Torr and electric power of high frequency is 150 W (0.5 w/cm$^2$). As shown in FIG. 2, responding to the increase of the concentration of $CH_3Br$, the etching rate of $SiO_2$ quickly decreases as the concentration of $CH_3Br$ increases, and as shown by the chain line at the position over six percent of the concentration of $CH_3Br$, the etching rate of $Si_3N_4$ is 1120 angstrom per minute and the selection ratio of $Si_3N_4/SiO_2$ is 13.5. And selection ratio of $Si_3N_4/P.R$ is 6.7.

As mentioned in the prior art, mixing of $CF_3$ Br into the mixed gas of $CF_4+5\%$ $O_2$, the selection ratio of $Si_3N_4/SiO_2$ increases. It is because Br reacts with O radical and suppresses the action of O radical which separates the combination of Si and O of $SiO_2$. In the present invention, using the mixed gas containing $CH_3Br$, provides not only the above-mentioned Br but also H separated from $CH_3Br$ reacts as, $$2H + O \rightarrow H_2 \quad (6)$$

by which the reaction of O radical is suppressed, so that the etching rates of $SiO_2$ and P.R rises and the selection ratio of $Si_3N_4/SiO_2$ or $Si_3N_4/P.R$ sharply increase.

Accordingly, by using the dry-etching method in accordance with the present invention, namely by using the mixed gas of carbon fluoride, $O_2$ and the gas having such a molecular structure that a part of H of hydrocarbon is replaced by halogen, the material of Si group such as $Si_3N_4$ can be etched with high selection ratio of such materials against $SiO_2$ mask, $SiO_2$ base or P.R mask as a result of such selective etching that the fluoride hardly etches the $SiO_2$ mask or base. In this embodiment, Br is used as halogen, but I has the same effect as Br.

What is claimed is:

1. A dry-etching method for etching silicon nitride having steps of:
    setting an etched material of said silicon nitride into a reaction chamber,
    supplying a mixed gas as an etching gas, which is made of carbon fluoride, oxygen and another gas having such a molecular structure that a part of hydrogen of hydro-carbon is replaced by bromine, into said reaction chamber, and
    giving high frequency electric power so as to make said mixed gas as plasma state and to etch said etched material.

2. A dry-etching method in accordance with claim 1, wherein
    said etching gas is a mixed gas of $CF_4$, $O_2$ and $CH_3Br$.

3. The method according to claim 2, wherein in said method about four to about eight volume percent $CH_3Br$ is employed.

4. The dry-etching method according to claim 2, wherein in said method about two to about twelve volume percent of $CH_3Br$ is employed.

5. The method according to claim 2, wherein in said method about four volume percent to about ten volume percent of $CH_3Br$ is employed.

6. A method for dry-etching comprising:
    providing a silicon nitride containing material to be etched into a reaction chamber;
    etching said material by contacting said material with the constituents of a plasma formed in a gas mixture which contains carbon floride, oxygen and a partially brominated or partially iodated hydrocarbon.

7. The method according to claim 6, wherein in said method about two to about 12 volume percent of said partially brominated or said partially iodated hydrocarbon is employed.

8. The method according to claim 6, wherein in said method about six volume percent of said partially brominated or said partially iodated hydrocarbon is employed.

9. The method according to claim 6, wherein in said method about four to about eight volume percent of said partially brominated or said partially iodated hydrocarbon is employed.

* * * * *